United States Patent
Iida

(10) Patent No.: US 8,682,517 B2
(45) Date of Patent: Mar. 25, 2014

(54) POWER SUPPLY SYSTEM, VEHICLE WITH THE SAME AND CHARGE/DISCHARGE CONTROL METHOD

(75) Inventor: Takahide Iida, Ichinomiya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 541 days.

(21) Appl. No.: 12/451,534

(22) PCT Filed: Jun. 10, 2008

(86) PCT No.: PCT/JP2008/060933
§ 371 (c)(1),
(2), (4) Date: Nov. 17, 2009

(87) PCT Pub. No.: WO2008/153170
PCT Pub. Date: Dec. 18, 2008

(65) Prior Publication Data
US 2010/0131137 A1   May 27, 2010

(30) Foreign Application Priority Data
Jun. 15, 2007 (JP) .................... 2007-158727

(51) Int. Cl.
*B60L 9/00* (2006.01)
*B60L 11/00* (2006.01)
*G01F 17/00* (2006.01)

(52) U.S. Cl.
USPC ............... 701/22; 702/60; 320/131; 320/134; 180/65.8; 290/40 C

(58) Field of Classification Search
USPC ............ 701/22; 320/124, 103, 126, 104, 131, 320/134; 702/60; 318/139; 290/40 C; 180/65.8; 710/22
See application file for complete search history.

(56) References Cited

U.S. PATENT DOCUMENTS 5,561,362 A   10/1996 Kawamura et al.
5,964,309 A * 10/1999 Kimura et al. ............... 180/65.8
(Continued)

FOREIGN PATENT DOCUMENTS

EP   0 828 304 A2   3/1998
FR   2 780 569 A1   12/1999
(Continued)

OTHER PUBLICATIONS

International Search Report for International Application No. PCT/JP2008/060933, issued Jul. 22, 2008.
(Continued)

*Primary Examiner* — Helal A Algahaim
*Assistant Examiner* — Yuri Kan
(74) *Attorney, Agent, or Firm* — Oliff PLC

(57) ABSTRACT

A vehicle starts traveling in an EV travel mode. When a reset request is issued to a first power storage unit, current control is performed to discharge actively the first power storage unit. After time when charging by an external power supply becomes allowed, a discharge current of the first power storage unit to be reset is kept at a constant current value, and a second power storage unit not to be reset is charged with a charge current including at least the discharge current of the first power storage unit. When a distinctive point appears on a battery voltage characteristic of the first power storage unit at a subsequent time, an estimated value of an SOC of the first power storage unit is reset to a predetermined reference value.

9 Claims, 10 Drawing Sheets

(56) References Cited

U.S. PATENT DOCUMENTS

| | | | |
|---|---|---|---|
| 5,982,146 A * | 11/1999 | Nguyen | 320/131 |
| 6,081,096 A * | 6/2000 | Barkat et al. | 320/124 |
| 6,223,106 B1 * | 4/2001 | Yano et al. | 701/22 |
| 6,225,784 B1 | 5/2001 | Kinoshita et al. | |
| 6,314,346 B1 * | 11/2001 | Kitajima et al. | 701/22 |
| 6,429,613 B2 * | 8/2002 | Yanase et al. | 318/139 |
| 6,445,982 B1 * | 9/2002 | Swales et al. | 701/22 |
| 6,522,960 B2 * | 2/2003 | Nada | 701/22 |
| 6,546,320 B2 * | 4/2003 | Shimizu et al. | 701/22 |
| 6,608,396 B2 * | 8/2003 | Downer et al. | 290/40 C |
| 6,661,108 B1 * | 12/2003 | Yamada et al. | 290/40 C |
| 6,757,598 B2 * | 6/2004 | Okoshi | 701/22 |
| 6,856,866 B2 * | 2/2005 | Nakao | 701/22 |
| 7,301,302 B2 * | 11/2007 | Yoshii | 320/104 |
| 7,610,124 B2 * | 10/2009 | Wakashiro et al. | 701/22 |
| 2002/0113595 A1 | 8/2002 | Sakai et al. | |
| 2003/0107352 A1 | 6/2003 | Downer et al. | |
| 2003/0120442 A1 * | 6/2003 | Pellegrino et al. | 702/60 |
| 2007/0216360 A1 * | 9/2007 | Matsui | 320/131 |
| 2008/0048619 A1 * | 2/2008 | Yoshida | 320/134 |
| 2008/0197801 A1 * | 8/2008 | Manor et al. | 320/103 |
| 2008/0272736 A1 * | 11/2008 | Tien et al. | 320/126 |
| 2009/0157244 A1 * | 6/2009 | Kim | 701/22 |
| 2010/0131137 A1 * | 5/2010 | Iida | 701/22 |

FOREIGN PATENT DOCUMENTS

| | | |
|---|---|---|
| JP | A-8-107606 | 4/1996 |
| JP | A-10-51906 | 2/1998 |
| JP | A-10-66267 | 3/1998 |
| JP | A-2001-169464 | 6/2001 |
| JP | A-2002-10502 | 1/2002 |
| JP | A-2003-209969 | 7/2003 |
| JP | A-2006-338889 | 12/2006 |
| JP | A-2007-17357 | 1/2007 |

OTHER PUBLICATIONS

Schmidt et al., "The Charge Equalizer—A New System to Extend Battery Lifetime in Photovoltaic Systems, U.P.S. and Electric Vehicles," *International Telecommunications Energy Conference*, 1993, pp. 146-151, Paris, France.

Extended Search Report issued in corresponding European Patent Application No. 08765626.0 dated May 6, 2011.

* cited by examiner

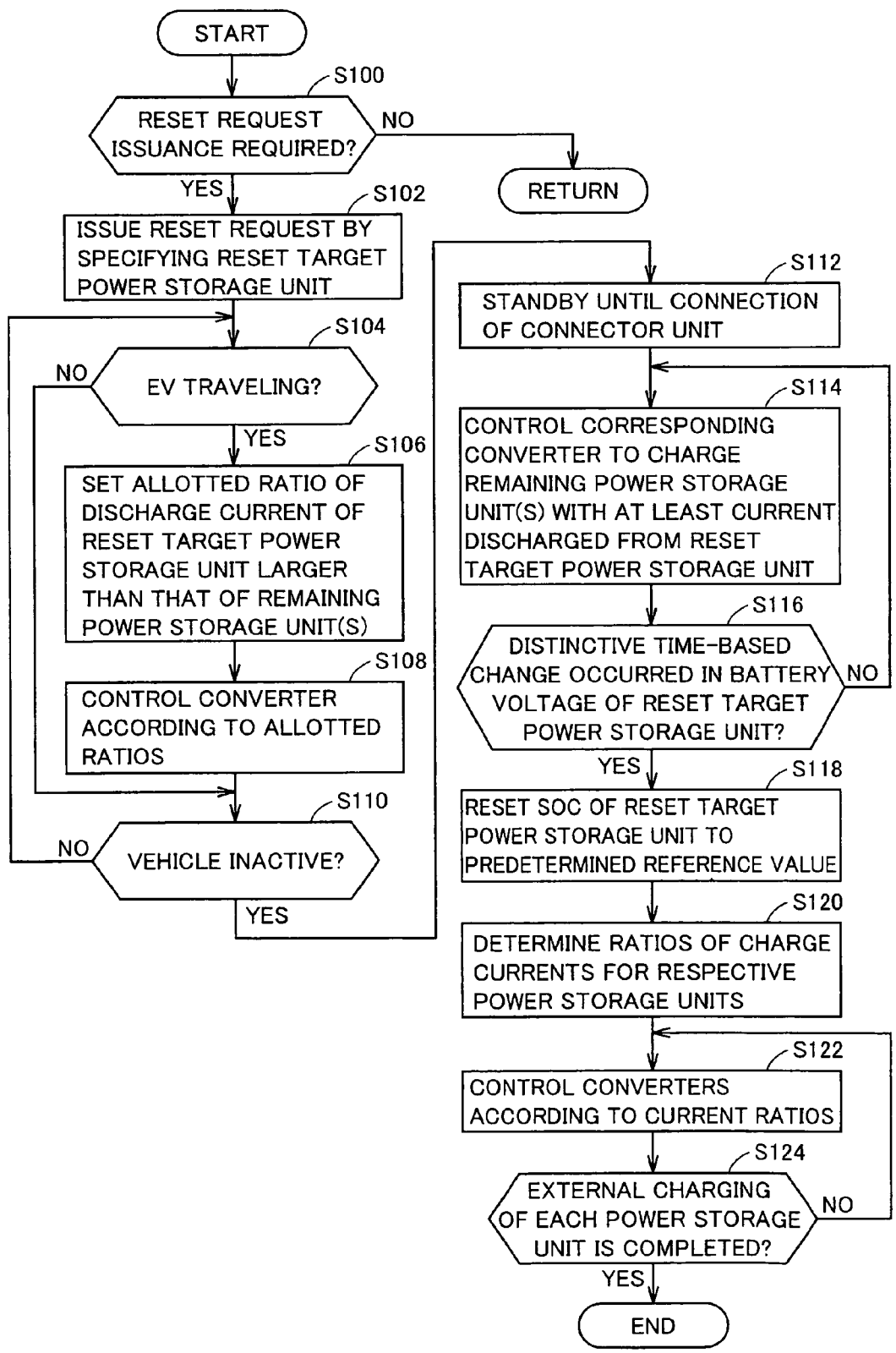

POWER SUPPLY SYSTEM, VEHICLE WITH THE SAME AND CHARGE/DISCHARGE CONTROL METHOD

TECHNICAL FIELD

The invention relates to a power supply system equipped with a plurality of rechargeable power storage units and a vehicle having that system as well as a charge/discharge control method for the power supply system, and particularly to a structure for keeping a high accuracy in estimation of charge state values.

BACKGROUND ART

In recent years, hybrid vehicles that employ an efficient combination of an engine and an electric motor for traveling have been practically used in view of environmental issues. The hybrid vehicle is equipped with a rechargeable power storage unit, which supplies an electric power to the motor generator for producing a drive power during start and acceleration, and also collects kinetic energy of the vehicle as an electric power during downhill travel and braking.

For the above hybrid vehicles, there has been proposed a structure in which the power storage unit mounted on the vehicle can be charged with an electric power supplied from an external power supply such as a commercial power. When the power storage unit is charged in advance by the external power supply as described above, the vehicle can travel, e.g., for a commute or shopping with its engine in non-operation if a distance traveled is relatively short. Therefore, total fuel consumption efficiency can be enhanced. This travel mode is also referred to as an "EV (Electric Vehicle) travel mode".

For enhancing the travel performance in the EV travel mode, it is desired to enhance a charge/discharge performance of the power storage unit. A structure employing a plurality of power storage units is already proposed as one of ways for enhancing the charge/discharge performance of the power storage units. In such structure, an electric power converting unit such as a converter for controlling the charge/discharge current of each power storage unit is arranged corresponding to each power storage unit. The purpose of this arrangement is to maintain an appropriate SOC (State Of Charge) value in each power storage unit by charging and discharging each power storage unit independently of the others, and thereby to avoid overcharge and overdischarge.

As an example of a structure that can perform the independent charge/discharge on each power storage unit, Japanese Patent Laying-Open No. 2002-010502 has disclosed a charge/discharge apparatus for storage batteries (power storage units) that can simultaneously charge and discharge a plurality of storage batteries.

As a method for estimating the SOC of each power storage unit, there is a known method using the fact that a specific relationship is present between the SOC of the power storage unit and an open-end voltage of the power storage unit. More specifically, according to this method, an open-end voltage of a target power storage unit is measured, and the SOC corresponding to the measured open-end voltage is determined with reference to relationship characteristics that have been obtained experimentally.

However, in a nickel hydrogen battery or the like that is a typical example of the power storage unit mounted on the hybrid vehicle, changes in open-end voltage are relatively small when the SOC is in a practical range. More specifically, the changes in open-end voltage of the power storage unit are small as compared with the changes in SOC of that power storage unit. Therefore, it is impossible to achieve sufficiently high estimation accuracy only by measuring the open-end voltage.

For increasing the estimation accuracy of the SOC, such a methodology is often employed that the SOC obtained by measuring the open-end voltage as described above is corrected based on an integrated value of the charge/discharge quantity of the power storage unit and this process is successively performed.

However, when the successive correction is performed based on the integrated value of the charge/discharge quantity of the power storage unit, this results in a problem that a deviation from the actual SOC gradually occurs due to an error in sensor or the like.

DISCLOSURE OF THE INVENTION

The invention has been made for overcoming the above problem, and an object of the invention is to provide a power supply system that can enhance an estimation accuracy of an SOC of a power storage unit as well as a vehicle with the same and a charge/discharge control method.

A power supply system according to an aspect of the invention includes a plurality of power storage units; a plurality of voltage converting units corresponding to the plurality of power storage units, respectively; a power line pair connected to the plurality of voltage converting units in parallel; a charging unit; a state estimating unit for estimating a charge state value of each of the plurality of power storage units; and a control unit. The charging unit charges the plurality of power storage units by receiving an electric power from an external power supply. The state estimating unit successively calculates the charge state value of each of the plurality of power storage units based on an integrated value of a charge/discharge quantity of each of the power storage units. The control unit controls the voltage converting operation in the plurality of voltage converting units. Further, when the plurality of power storage units become chargeable by the external power supply, the control unit controls the voltage converting unit corresponding to a first power storage unit among the plurality of power storage units to discharge the first power storage unit, and controls the voltage converting unit corresponding to the remaining power storage unit(s) to charge the remaining power storage unit(s) with at least the discharge current discharged from the first power storage unit. The state estimating unit resets the charge state value of the first power storage unit to a reference value based on the first power storage unit during the period when the plurality of power storage units are chargeable by the external power supply.

According to the invention, when the charging by the external power supply is allowed, a predetermined current is discharged from the first power storage unit by controlling the voltage converting unit. The charge state value of the first power storage unit that is successively calculated by the state estimating unit is reset based on the value of the voltage the first power storage unit caused this discharge current. Therefore, even when an error due to an integrated value of the charge/discharge quantity occurs in the charge state value of the first power storage unit, the reset (calibration) can be performed before the external charging. This can enhance the estimation accuracy of the SOC of the power storage unit.

Preferably, the state estimating unit resets the charge state value of the first power storage unit to the reference value at predetermined timing based on a time-based change in discharge voltage of the first power storage unit.

Preferably, the control unit controls the voltage converting unit corresponding to the first power storage unit to charge the first power storage unit with the charge current supplied from the charging unit after the state estimating unit resets the charge state value of the first power storage unit to the reference value, and controls the corresponding voltage converting unit such that the charge current supplied to the first power storage unit is larger than the charge current supplied to the remaining power storage unit or units.

Preferably, the charging unit is electrically connected between the first power storage unit and the power converting unit corresponding to the first power storage unit.

Preferably, the power supply system further includes a request generating unit for generating a reset request for the first power storage unit based on a charge/discharge frequency of the first power storage unit. The control unit starts the discharging from the first power storage unit in response to the reset request during the charging by the external power supply.

Further preferably, the request generating unit is able to select the power storage unit specified by the reset request, based on the respective charge frequencies of the plurality of power storage units.

Further preferably, the power supply system is configured to be able to supply an electric power to a load device (MG2) electrically connected to the power supply system via the power line pair, and the control unit controls the plurality of power converting units in response to the reset request such that the discharge current discharged from the first power storage unit to the load device is larger than the discharge current discharged from each of the remaining power storage unit to the load device, before the start of charging the plurality of power storage units by the external power supply.

A vehicle according to an aspect of the invention includes an engine; a plurality of power storage units; a plurality of voltage converting units corresponding to the plurality of power storage units, respectively; a power line pair connected to the plurality of voltage converting units in parallel; a charging unit; an electric motor; a power generating unit; a state estimating unit estimating a charge state value of each of the plurality of power storage units; a control unit; and a request generating unit. The charging unit charges the plurality of power storage units by receiving an electric power from an external power supply. The electric motor is connected to the power line pair for generating a drive power by receiving the electric power from the plurality of power storage units. The power generating unit is connected to the power line pair for generating the electric power by receiving the drive power from the engine. The state estimating unit successively calculates the charge state value of each of the plurality of power storage units based on an integrated value of a charge/discharge quantity of each of the power storage units. The control unit controls the voltage converting operation in the plurality of voltage converting units. The request generating unit generating a reset request for one of the plurality of power storage units based on charge/discharge frequencies of the plurality of power storage units. The vehicle is able to travel by selecting a first travel mode for restricting the charging of the plurality of power storage units by the power generating unit and a second travel mode for controlling the charging of the plurality of power storage units by the power generating unit to keep a charge state value of each of the power storage units within a predetermined range. When the reset request is issued, the control unit controls the plurality of power converting units such that the discharge current discharged from the power storage unit to be reset specified by the reset request to the electric motor becomes larger than the discharge current discharged from each of the remaining power storage unit or units to the electric motor, during the traveling in the first travel mode. When the reset request is issued and a state allowing the charging of the plurality of power storage units by the external power supply is attained, the control unit controls the voltage converting unit or units corresponding to the power storage unit to be reset to discharge the power storage unit to be reset, and controls the voltage converting unit or units corresponding to the remaining power storage unit or units to charge the remaining power storage unit or units with at least the discharge current discharged from the power storage unit to be reset. The state estimating unit resets the charge state value of the power storage unit to be reset to a reference value based on the voltage value of the power storage unit to be reset during the period when the plurality of power storage units are chargeable by the external power supply.

According to further another aspect, the invention provides a charge/discharge control method of a power supply system provided with a plurality of power storage units. The power supply system includes a plurality of voltage converting units corresponding to the plurality of power storage units, respectively, a power line pair connected to the plurality of voltage converting units in parallel, and a charging unit for charging the plurality of power storage units by receiving an electric power from an external power supply. The charge/discharge control method includes a step of successively calculating a charge state value of each of the plurality of power storage units based on an integrated value of a charge/discharge quantity of each of the power storage units; a step of controlling the voltage converting unit corresponding to the first power storage unit among the plurality of power storage units to discharge a first power storage unit, and controlling the voltage converting unit corresponding to the remaining power storage unit(s) to charge the remaining power storage unit(s) with at least the discharge current discharged from the first power storage unit, when the plurality of power storage units become chargeable by the external power supply; and a step of resetting the charge state value of the first power storage unit to a reference value based on the voltage value the first power storage unit during the period when the plurality of power storage units are chargeable by the external power supply.

The present invention can enhance the estimation accuracy of the SOC of the power storage unit.

BRIEF DESCRIPTION OF THE DRAWINGS

FIG. 10 is a flowchart illustrating a processing procedure of the rest operation according to the embodiment of the invention.

BEST MODES FOR CARRYING OUT THE INVENTION

Embodiments of the invention will be described with reference to the drawings. In the following description, the same or corresponding portions bear the same reference numbers, and description thereof is not repeated.

(Overall Structure)

Figure 1:
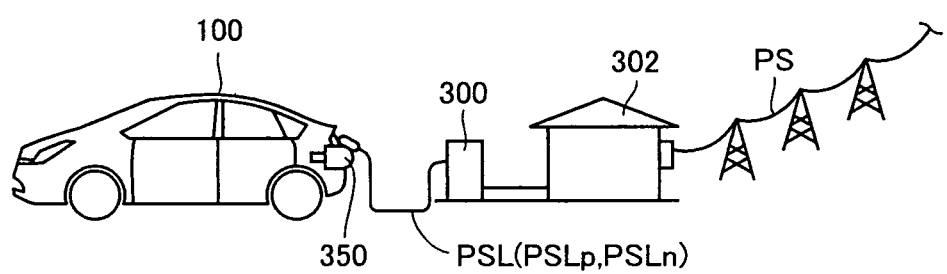
FIG. 1 shows an overall structure for charging a vehicle provided with a power supply system according to an embodiment of the invention by an external power supply.

FIG. 1 shows an overall structure for charging a vehicle 100 provided with a power supply system according to an embodiment of the invention by an external power supply.

Referring to FIG. 1, vehicle 100 according to the embodiment of the invention is typically a hybrid vehicle, which is equipped with an engine and electric motors (motor generators), and is driven by controlling ratios between drive powers of them as will be described later. Further, vehicle 100 is equipped with a plurality of power storage units for supplying an electric power to the motor generators. These power storage units can be charged by receiving a drive power generated by the operation of the engine when vehicle 100 is in a system active state (which may also be referred to as an "IG-ON state" hereinafter). When vehicle 100 is in a system-stopped state (which may also be referred to as an "IG-OFF state"), the power storage units can be electrically connected to an external power supply via a connector unit 350 and thereby can be charged. For discriminating between these types of charge operations in the following description, the charging of the power storage unit by the external power supply may also be referred to as "external charging", and the charging of the power storage unit by the operation of the engine may also be referred to as "internal charging".

Connector unit 350 typically forms a coupling mechanism that supplies an external electric power such as a commercial power to vehicle 100, and is connected to a charge station 300 via a power line PSL made of a cabtire cable or the like. In the external charging operation, connector unit 350 is coupled to vehicle 100 for electrically connecting the external power supply to a charging unit (not shown) arranged on vehicle 100. Vehicle 100 is provided with a connector accepting unit (not shown) that is coupled to connector unit 350 for accepting the external power supply.

A charge station 300 supplies connection unit 350 with a part of the commercial power supplied to a house 302 via a commercial power supply line PS. Charge station 300 may include a mechanism for accommodating connector unit 350 and/or a mechanism for winding power line PSL connected to connector unit 350, although these mechanisms are not shown. Charge station 300 may also include a security mechanism and/or a billing or charging mechanism for users. Further, charge station 300 may include a mechanism for communications with vehicle 100.

An electric power, e.g., generated by a solar cell panel installed on a roof of house 302 may be employed as the external power supply supplied to vehicle 100 via connector unit 350, instead of or together with the commercial power.

(Schematic Structure of the Vehicle)

Figure 2:
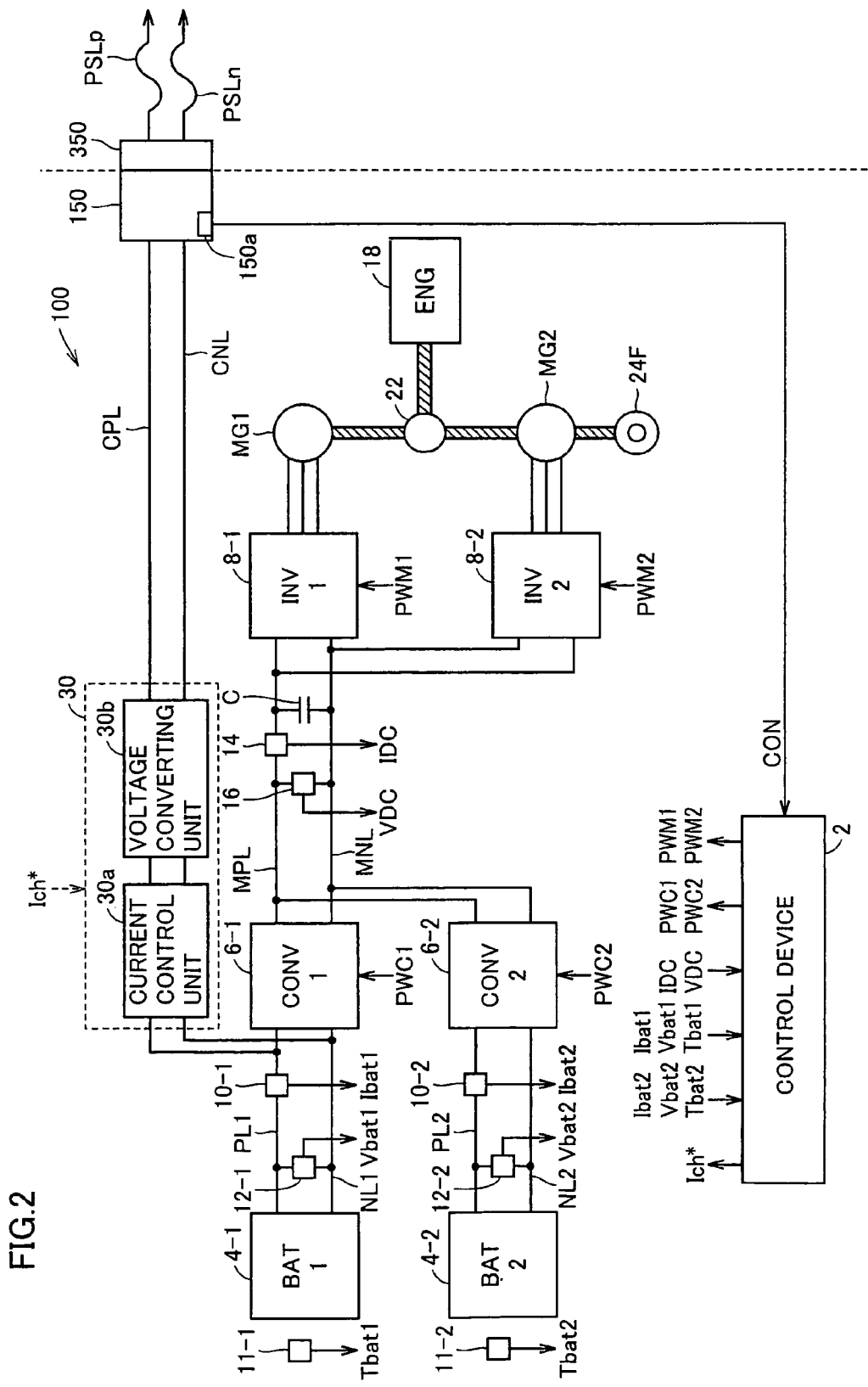
FIG. 2 shows a schematic structure of the vehicle provided with the power supply system according to the embodiment of the invention.

FIG. 2 schematically shows a structure of vehicle 100 provided with the power supply system according to the embodiment of the invention. As a typical example of the vehicle provided with the plurality of power storage units, FIG. 2 shows vehicle 100 provided with two power storage units 4-1 and 4-2. In the following description, power storage units 4-1 and 4-2 may also be referred to as "BAT1" and "BAT2", respectively.

Referring to FIG. 2, vehicle 100 includes an engine (ENG) 18 as well as first and second motor generators MG1 and MG2 as drive power sources. These are mechanically coupled via a power splitting mechanism 22. Depending on a situation of traveling of vehicle 100, the drive powers are distributed to these three parts or coupled together so that drive wheels 24F are driven.

When vehicle 100 travels (i.e., when the external charging is not performed), power splitting mechanism 22 divides the drive power generated by the operation of engine 18 into two parts, which are distributed to first and second motor generators MG1 and MG2, respectively. The drive power distributed from power splitting mechanism 22 to first motor generator MG1 is used in the electric power generating operation. The drive power distributed to second motor generator MG2 is combined with the drive power generated by second motor generator MG2 and is used for driving drive wheels 24F.

Each of first inverter (INV1) 8-1 and second inverter (INV2) 8-2 that correspond to motor generators MG1 and MG2, respectively, converts DC power to AC power, or vice versa. Primarily, first inverter 8-1 converts AC power generated by first motor generator MG1 to DC power according to a switching command PWM1 provided from a control device 2, and supplies the converted power to positive and negative bus lines MPL and MNL. Second inverter 8-2 converts DC power supplied via positive and negative bus lines MPL and MNL to AC power according to a switching command PWM2 provided from control device 2, and supplies the converted power to second motor generator MG2. Thus vehicle 100 includes, as a load device, second motor generator MG2 that receives the electric powers from power storage units 4-1 and 4-2 to generate the drive power, and also includes first motor generator MG1 that is an electric generator receiving the drive power from engine 18 to generate the electric power.

Each of first and second power storage units 4-1 and 4-2 is a rechargeable power storage element, and is typically formed of a secondary battery such as a lithium ion battery or a nickel hydrogen battery, or an electricity storage element such as an electrical double layer capacitor. Between first power storage unit 4-1 and first inverter 8-1, there is arranged a first converter (CONV1) 6-1 that can perform bidirectional voltage conversion of DC voltage, and performs step-up or step-down between the input/output voltage of power storage unit 4-1 and a line voltage between positive and negative bus lines MPL and MNL, bidirectionally. Likewise, between second power storage unit 4-2 and second inverter 8-2, there is arranged a second converter (CONV2) 6-2 that can perform bidirectional voltage conversion on DC voltage, and performs step-up or step-down between the input/output voltage of power storage unit 4-2 and the line voltage between positive and negative bus lines MPL and MNL, bidirectionally. Thus, converters 6-1 and 6-2 arranged in parallel are connected to positive and negative bus lines MPL and MNL. The step-up/down operations of converters 6-1 and 6-2 are controlled according to switching commands PWC1 and PWC2, respectively, that are provided from control device 2.

Control device 2 is typically formed of an ECU (Electronic Control Unit) primarily including a CPU (Central Processing Unit), a storage unit such as an RAM (Random Access Memory) and an ROM (Read Only Memory), and an input/output interface unit. The CPU reads a program prestored in the ROM or the like into the RAM and executes it, and thereby control device 2 performs the control relating to the vehicle traveling (including internal charging) and the external charging.

For example, the information provided to control device 2 includes battery currents Ibat1 and Ibat2 provided from current sensors 10-1 and 10-2 interposed in positive lines PL1 and PL2, respectively, a battery voltage Vbat1 provided from a voltage sensor 12-1 arranged between positive and negative lines PL1 and NL1, a battery voltage Vbat2 provided from a voltage sensor 12-2 arranged between positive and negative lines PL2 and NL2, battery temperatures Tbat1 and Tbat2 that are provided from temperature sensors 11-1 and 11-2 arranged near power storage units 4-1 and 4-2, respectively, a bus line current IDC provided from a current sensor 14 interposed in positive bus line MPL, and a bus line voltage VDC provided from a voltage sensor 16 arranged in between positive and negative bus lines MPL and MNL.

Control device 2 continuously estimates the State Of Charge (which may also be referred to as the "SOC" hereinafter) of each of power storage units 4-1 and 4-2. The SOC can be represented by an absolute value (for example in units of A·h) of the quantity of charge of the power storage unit. In the specification, however, the SOC is represented by a ratio (0%-100%) of an actual quantity of charge with respect to the charge capacity of the power storage unit. More specifically, control device 2 successively calculates the SOC of power storage unit 4-1 based on the integrated value of the charge/discharge quantity of power storage unit 4-1, and successively calculates the SOC of power storage unit 4-2 based on the integrated value of the charge/discharge quantity of power storage unit 4-2. The integrated value of the charge/discharge quantity can be obtained by integrating a product of the battery voltage and the battery current (electric power) of the corresponding power storage unit with respect to the time.

Vehicle 100 further includes a connector accepting unit 150 and a charging unit 30 as a structure for externally charging power storage units 4-1 and 4-2. For externally charging power storage units 4-1 and 4-2, connector unit 350 is coupled to connector accepting unit 150 so that the external power supply supplies the electric power to charging unit 30 via positive charge line CPL and negative charge line CNL. Connector accepting unit 150 includes a coupling sensor 150a for sensing the state of coupling between connector accepting unit 150 and connector unit 350, and control device 2 detects that the state allowing the charging by the external power supply is attained, according to a coupling signal CON provided from coupling sensor 150a. This embodiment is described in connection with the example that uses a commercial single-phase AC power as the external power supply.

In this specification, "the state allowing the charging by the external power supply" typically represents the state in which connector unit 350 is physically inserted into connector accepting unit 150. The structure shown in FIGS. 1 and 2 may be replaced with a structure that couples electromagnetically the external power supply and the vehicle in a non-contact fashion for supplying the electric power. More specifically, primary and secondary coils may be arranged on the external power supply side and the vehicle side, respectively, and the power supply may be performed using a mutual inductance between the primary and secondary coils. In this structure, "the state allowing the charging by the external power supply" means the state in which the primary and secondary coils are positioned appropriately.

Charging unit 30 is a device for externally charging power storage units 4-1 and 4-2 with the power received from the external power supply, and is arranged between positive and negative lines PL1 and NL1 on one side and positive and negative charge lines CPL and CNL on the other side. Thus, charging unit 30 is electrically connected between first power storage unit 4-1 and first converter 6-1 corresponding to first power storage unit 4-1.

Charging unit 30 includes a current control unit 30a and a voltage converting unit 30b, and converts the power supplied from the external power supply to the power suitable for charging power storage units 4-1 and 4-2. More specifically, voltage converting unit 30b is a device for converting the voltage supplied from the external power supply to the voltage suitable for charging power storage units 4-1 and 4-2, and is typically formed of a wire-wound transformer having a predetermined transformation ratio, an AC-AC switching regulator or the like. Further, current control unit 30a produces DC voltage by rectifying AC voltage produced by the voltage conversion by voltage converting unit 30b, and controls the charge current supplied to power storage units 4-1 and 4-2 according to an charge current command Ich* provided from control device 2. Current control unit 30a is typically formed of a single-phase bridge circuit. Instead of the structure having current control unit 30a and voltage converting unit 30b, charging unit 30 may be implemented by an AC-DC switching regulator or the like.

In particular, control device 2 according to the embodiment determines whether reset requests for power storage units 4-1 and 4-2 (which may also be referred to as "SOC1 reset request" and "SOC2 reset request" hereinafter) are present or not, based on charge/discharge frequencies (i.e., frequencies of charge/discharge) of power storage units 4-1 and 4-2, respectively. When it is determined that the SOC of one of power storage units 4-1 and 4-2 is to be reset, the SOC reset operation is executed during a period when the charging by the external power supply is allowed. More specifically, control device 2 controls the corresponding converter (e.g., first converter 6-1) to discharge the power storage unit (e.g., first power storage unit 4-1) to be reset, and also controls the corresponding converter (e.g., second converter 6-2) to charge the remaining power storage unit or units (e.g., second power storage unit 4-2) with at least the current discharged from the power storage unit to be reset. When the allowed charge current value for the remaining power storage unit(s) is larger than the discharged current value of the power storage unit to be reset, charging unit 30 may supply the charge current to compensate for a difference between them. Control device 2 resets the SOC of the power storage unit to be reset to a reference value, e.g., of 5%, based on the voltage of the power storage unit to be reset. More specifically, the SOC is reset to the reference value according to a certain timing that is based on the time-based change in discharge voltage of the power storage unit to be reset. The time-based change in discharge voltage is, e.g., a distinctive point in the battery voltage that changes (lowers) according to discharging of the power storage unit as will be described later. Alternatively, the SOC may be reset to the reference value when the voltage of the power storage unit to be reset becomes lower than a predetermined threshold This reference value may be set in advance based on characteristic values of the power storage unit, or may be dynamically set according to a state of use of the battery.

As described above, the SOC of each power storage unit is reset at a predetermined frequency so that the SOC can be accurately estimated without an influence of sensing errors in current sensors 10-1 and 10-2, voltage sensors 12-1 and 12-1, and the like.

Further, after the SOC of the power storage unit to be reset is reset to the predetermined reference value, control device 2 performs the charging (i.e., external charging) of the power storage unit to be reset with the charge current supplied from charging unit 30, and controls the corresponding converter to provide the charge current larger than the charge current for the remaining power storage unit(s). This optimizes the respective charge currents for power storage units 4-1 and 4-2 to finish the external charging of them at substantially the same time.

Vehicle 100 according to the embodiment is the hybrid vehicle, in which the drive power supplied from engine 18 can be used for traveling and for charging power storage units 4-1 and 4-2. Conversely, in the form of externally charging power storage units 4-1 and 4-2 for using them, it is preferable to drive the vehicle with engine 18 kept in a non operating state as far as possible. Therefore, vehicle 100 is configured to allow selection of an EV (Electric Vehicle) travel mode and an HV (Hybrid Vehicle) travel mode for the traveling.

More specifically, in the EV travel mode, vehicle 100 primarily travels using only the drive power supplied from second motor generator MG2 until the SOC of each of power storage units 4-1 and 4-2 becomes lower than a predetermined value. In this EV travel mode, first motor generator MG1 does not perform the power generating operation using the drive power of engine 18, and the internal charging of power storage units 4-1 and 4-2 is restricted. Although the EV travel mode is selected for improving the fuel communication efficiency by keeping engine 18 in a non operating state, engine 18 may be started in this mode, when a driver applies a drive power request for rapid acceleration, when a request irrelevant to the drive power request is made in connection with catalyst warming or air conditioning, when another condition is satisfied, or the like.

When the SOC of each of power storage units 4-1 and 4-2 becomes lower than a predetermined value during the EV travel mode, the travel mode changes to the HV travel mode. In the HV travel mode, vehicle 100 controls the electric power generating operation of first motor generator MG1 so that the SOC of each of power storage units 4-1 and 4-2 may be kept within a predetermined range around a predetermined control center value. In response to the power generating operation of first motor generator MG1, engine 18 starts to operate. A part of the drive power generated by engine 18 is used for driving vehicle 100.

For reducing a time required for the external charging, it is desired to set the power storage unit to be reset to a low-charged state before the start of the foregoing reset operation. Therefore, when control device 2 according to the embodiment determines that one of the power storage units is to be reset, it actively discharges the power storage unit to be reset while vehicle 100 is traveling in the EV travel mode before the external charging. More specifically, control device 2 controls each converter so that the current discharged from the power storage unit to be reset to second motor generator MG2 may be larger than the current discharged from the remaining power storage unit(s) to second motor generator MG2. In the EV travel mode, the powers are discharged from power storage units 4-1 and 4-2 so that the reset operation can be performed rapidly by preferentially discharging one of the power storage units.

The correlation between the embodiment of the invention shown in FIG. 2 and the present invention is as follows. Power storage units 4-1 and 4-2 correspond to a plurality of "power storage units", converters 6-1 and 6-2 correspond to a plurality of "voltage converting units", positive and negative bus lines MPL and MNL correspond to a "power line pair", charging unit 30 corresponds to a "charging unit", second motor generator MG2 corresponds to a "load device" and an "electric motor", engine (ENG) 19 corresponds to an "engine", and first motor generator MG1 corresponds to a "power generating unit". Further, the "EV travel mode" corresponds to a "first travel mode", and the "HV travel mode" corresponds to a "second travel mode".

(Control Structure)

Figure 3:
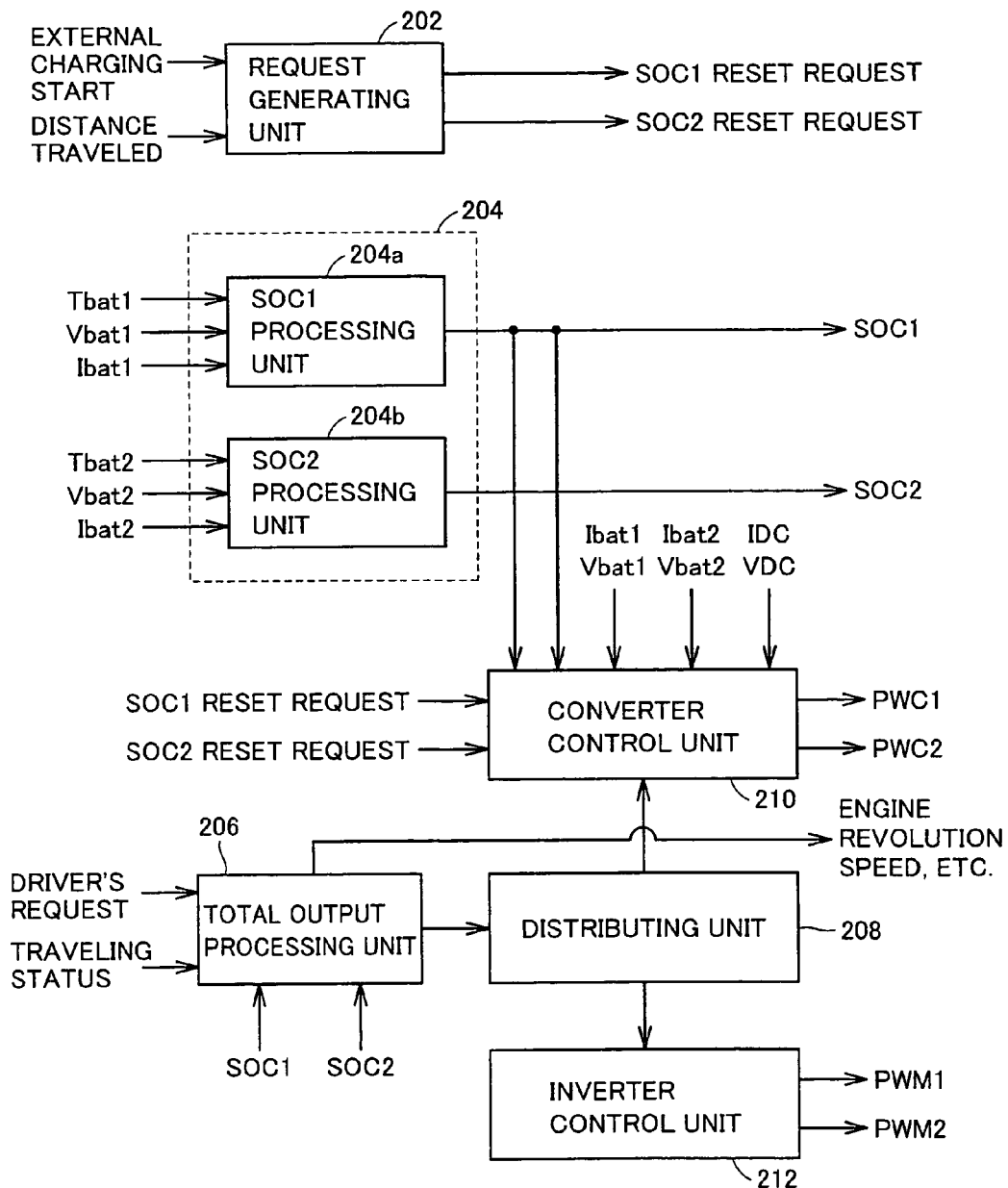
FIG. 3 is a block diagram showing a control structure in a control device according to the embodiment of the invention.

Referring to FIG. 3, description will be given on the control structure for implementing the reset operation in the power supply system according to the embodiment.

FIG. 3 is a block diagram showing a control structure in control device 2 according to the embodiment of the invention. Each function block shown in FIG. 3 is typically implemented by execution of a prestored program by control device 2, but the functions thereof may be partially or entirely implemented by dedicated hardware.

Referring to FIG. 3, control device 2 includes, as its functions, a request generating unit 202, a state estimating unit 204, a total output processing unit 206, a distributing unit 208, a converter control unit 210, and an inverter control unit 212.

Request generating unit 202 generates the reset requests for power storage units 4-1 and 4-2 based on the charge frequencies of power storage units 4-1 and 4-2, respectively.

Figure 4:
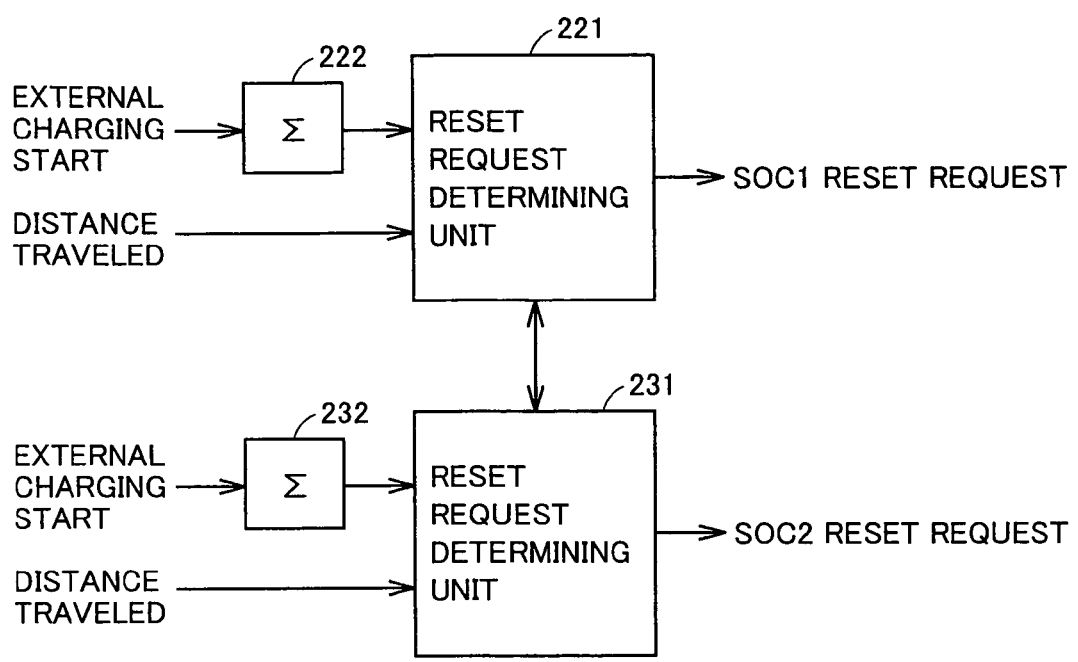
FIG. 4 is a block diagram showing a more specific control structure in a request generating unit shown in FIG. 3.

FIG. 4 is a block diagram showing a more specific control structure in request generating unit 202 shown in FIG. 3.

Referring to FIG. 4, request generating unit 202 includes a reset request determining unit 221 and an integrating unit 222 as function blocks for generating an SOC1 reset request for first power storage unit 4-1. Also, request generating unit 202 includes a reset request determining unit 231 and an integrating unit 232 as function blocks for generating an SOC2 reset request for power storage unit 4-2.

Reset request determining unit 221 determines whether the SOC1 reset request is to be issued or not, based on a total number of times of starting the external charging and/or a distance traveled. More specifically, integrating unit 222 integrates the signal of starting the external charging based on coupling signal CON provided from coupling sensor 150a (FIG. 2), and the integrated number is provided to reset request determining unit 221. Reset request determining unit 221 receives the distance traveled from a vehicle speed sensor (not shown) or the like. Reset request determining unit 221 determines whether the integrated number or the distance traveled calculated after the last SOC1 reset request was issued exceeds a corresponding predetermined threshold (e.g., ten times of external charging or 100 km) or not. When the above number or the distance exceeds the threshold, the SOC1 reset request is issued.

Since the error in SOC of the power storage unit is accumulated as the number of times of charging increases, reset request determining unit 221 reflects the influence of the error due to the external charging based on the integrated number of times of the external charging, and also reflects the influence of the error due to the internal charging based on the distance traveled.

The same is true with respect to the operations in reset request determining unit 231 and integrating unit 232, and description thereof is not repeated. Reset request determining units 221 and 231 may cooperate with each other for preventing the simultaneous issuing of the SOC1 and SOC2 reset requests. Further, the SOC1 and SOC2 reset requests may be generated alternately.

Referring to FIG. 3 again, state estimating unit 204 estimates the SOCs of power storage units 4-1 and 4-2 based on battery temperatures Tbat1 and Tbat2, battery currents Ibat1 and Ibat2, battery voltages Vbat1 and Vbat2, and the like, respectively. More specifically, state estimating unit 204 includes SOC1 processing unit 204a for calculating the SOC1 of first power storage unit 4-1 and SOC2 processing unit 204b for calculating the SOC2 of second storage unit 4-2.

Figure 5:
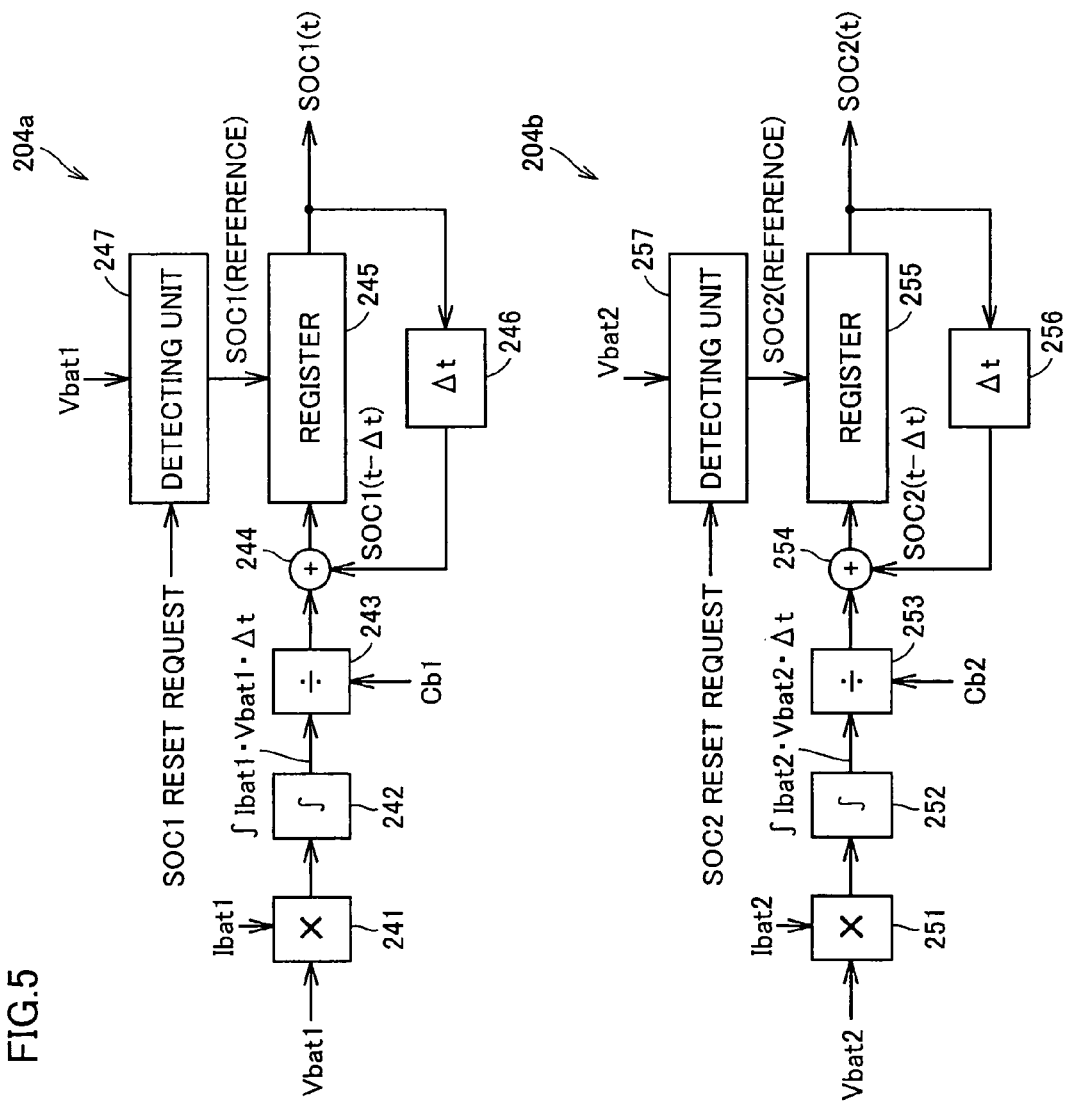
FIG. 5 is a block diagram showing a more specific control structure in a state estimating unit shown in FIG. 3.

FIG. 5 is a block diagram showing a more specific control structure in state estimating unit 204 shown in FIG. 3.

Referring to FIG. 5, SOC1 processing unit 204a includes a multiplying unit 241, integrating unit 242, dividing unit 243, adding unit 244, register 245, delay unit 246 and detecting unit 247. SOC2 detecting unit 204b includes a multiplying unit 251, integrating unit 252, dividing unit 253, adding unit 254, register 255, delay unit 256 and detecting unit 257. SOC1 processing unit 204a and SOC2 processing unit 204b successively calculate the SOCs of the corresponding power storage units based on the integrated values of the charge/discharge quantities of the corresponding power storage units.

More specifically, multiplying unit 241 multiplies battery voltage Vbat1 by battery current Ibat1 to obtain the instantaneous charge/discharge quantity (electric power) of power storage unit 4-1, and integrating unit 242 integrates this charge/discharge quantity over a processing cycle $\Delta t$. Further, dividing unit 243 divides an integrated value $\int Ibat1 \cdot Vbat1 \cdot \Delta t$ of the charge/discharge quantity obtained by integrating unit 242 by a charge capacity Cb1 of power storage unit 4-1. Thus, the processed result provided from dividing unit 243 indicates a rate of change in SOC 1 in the last processing cycle $\Delta t$.

Register 245 holds and outputs SOC1(t) that is the SOC of power storage unit 4-1 in each processing cycle. Delay unit 246 holds and outputs SOC1(t–$\Delta t$) obtained by delaying SOC1(t) held by and output from register 245 by processing cycle $\Delta t$. Adding unit 244 adds SOC1(t–$\Delta t$) in the last processing cycle to the change rate of SOC1 currently output from dividing unit 243, and thereby calculates SOC1(t) in the current processing cycle.

As described above, SOC1 processing unit 204a successively calculates SOC1 of first power storage unit 4-1 based on the integrated value of the charge/discharge quantity of first power storage unit 4-1. Similarly to SOC1 processing unit 204a, SOC2 processing unit 204b successively calculates SOC2 of second power storage unit 4-2 based on the integrated value of the charge/discharge quantity of second power storage unit 4-2.

Further, in response to the SOC1 reset request issued by request generating unit 202 (FIG. 3), detecting unit 247 resets the SOC1 that is successively calculated to a reference value, i.e., SOC1 (REFERENCE) at predetermined timing based on the time-based change in battery voltage Vbat1 (during discharging) of first power storage unit 4-1. More specifically, when the SOC1 reset request is issued, the active discharging from first power storage unit 4-1 starts so that the battery voltage Vbat1 of first power storage unit 4-1 lowers with time. Detecting unit 247 detects the distinctive change that occurs when battery voltage Vbat1 lower with time, and forcedly inputs SOC1 (REFERENCE) to register 245.

Likewise, in response to the SOC2 reset request issued by request generating unit 202 (FIG. 3), detecting unit 257 resets the SOC2 that is successively calculated to a reference value, i.e., SOC2 (REFERENCE) at predetermined timing based on the time-based change in battery voltage Vbat2 (during discharging) of second power storage unit 4-2.

Figure 6:
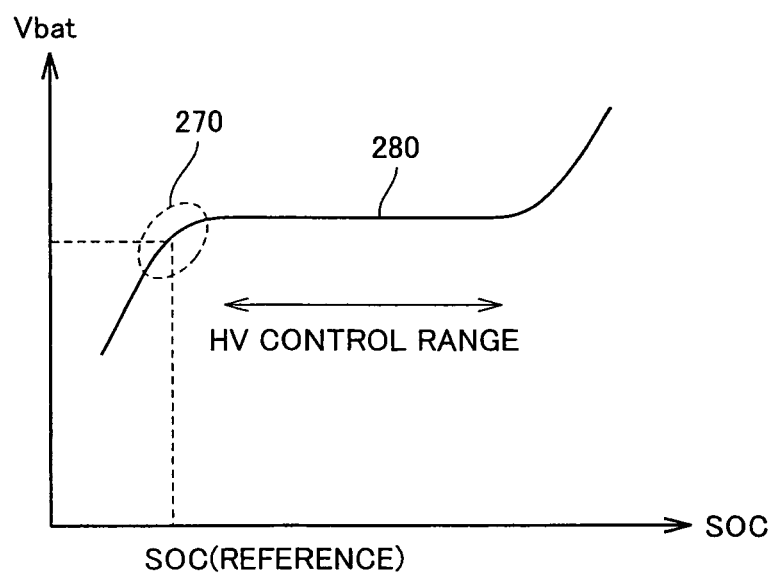
FIG. 6 shows an example of distinctive changes in battery voltage detected by a detecting unit shown in FIG. 5.

FIG. 6 shows an example of distinctive changes in battery voltages Vbat1 and Vbat2 detected by detecting units 247 and 257 shown in FIG. 5, respectively. In FIG. 6, battery voltages Vbat1 and Vbat2 are collectively represented as "Vbat", and SOC1 and SOC2 are collectively represented as "SOC".

Referring to FIG. 6, a specific correlation is present between the SOC and battery voltages Vbat of each of power storage units 4-1 and 4-2 that are typically formed of nickel hydrogen batteries or the like. Particularly, in the nickel hydrogen battery, there is a flat region 280 in which the change in battery voltage Vbat with respect to the change in SOC is small. This flat region 280 overlaps an HV control range in which the SOCs of power storage units 4-1 and 4-2 are to be kept in the foregoing HV travel mode. In flat region 280, therefore, it is difficult to detect a distinctive change in each of power storage units 4-1 and 4-2.

In contrast, a region (distinctive region 270) in which a larger change occurs in battery voltage Vbat with respect to the change in SOC is present in the region (on the overdischarge side) where the SOC is relatively low. Since this distinctive region 270 always occurs corresponding to substantially the same SOC, the SOCs of power storage units 4-1 and 4-2 can be appropriately reset by experimentally obtaining in advance the SOCs corresponding to distinctive region 270.

More specifically, detecting units 247 and 257 continuously monitor battery voltages Vbat1 and Vbat2 that change with time according to the discharging of corresponding power storage units 4-1 and 4-2, and calculate, where necessary, the time-base changes in quantity of battery voltages Vbat1 and Vbat2, respectively. When quantities of the time-based changes in battery voltages Vbat1 and Vbat2 thus calculated become lower than predetermined negative thresholds, i.e., when battery voltages Vbat1 and Vbat2 start sudden lowering, detecting units 247 and 257 reset the SOC1 and SOC2 that are exhibited at this point in time to corresponding SOC (REFERENCE), respectively.

As will be described below, it is preferable that the discharge currents from power storage units 4-1 and 4-2 are constant in value, for sensing more accurately the distinctive changes in battery voltages Vbat1 and Vbat2.

Referring to FIG. 3 again, total output processing unit 206 calculates the total output required for the traveling of vehicle 100, according to the driver's request and the traveling status. The driver's request includes a press-down amount of an accelerator pedal, a press-down amount of a brake pedal, a position of a shift lever (all of which are not shown) and the like. The traveling status includes information representing that vehicle 100 is accelerating or decelerating, and others. Total output processing unit 206 determines the engine revolution speed according to the drive power that is required in engine 18 for providing the total output. The calculated result of total output processing unit 206 is transmitted to distributing unit 208.

Distributing unit 208 calculates torques and/or revolution speeds of motor generators MG1 and MG2 according to the processed result provided from total output processing unit 206, provides its control command to inverter control unit 212 and also provides converter control unit 210 with the control command corresponding to demand and supply of the power in vehicle 100.

Inverter control unit 212 produces switching commands PWM1 and PWM2 for driving motor generators MG1 and MG2, respectively, according to the control command provided from distributing unit 208. Switching commands PWM1 and PWM2 are provided to inverters INV1 and 1NV2, respectively.

In response to the control command from distributing unit 208, converter control unit 210 determines allotted ratios of the discharge power with reference to the SOC1 and SOC2 calculated by state estimating unit 204 so that power storage units 4-1 and 4-2 can supply the respective predetermined discharge powers to second motor generator MG2. Converter control unit 210 produces switching commands PWC1 and PWC2 so that power storage units 4-1 and 4-2 may discharge the respective powers to be shared. Converters 6-1 and 6-2 perform the voltage conversion according to switching commands PWC1 and PWC2 so that the discharge powers (discharge currents) of power storage units 4-1 and 4-2 are controlled, respectively.

Particularly, converter control unit 210 controls the voltage converting operations in converters 6-1 and 6-2 when the reset operations are executed in power storage units 4-1 or 4-2. More specifically, when request generating unit 202 issues the SOC1 reset request or SOC2 reset request, converter control unit 210 actively discharges the power storage unit to be reset.

During the reset operation, converter control unit 210 controls the converter corresponding to the power storage unit to be reset so as to discharge an appropriate quantity of current from the power storage unit to be reset, and controls the converter corresponding to the remaining power storage unit to charge it at with at least the current discharged from the power storage unit(s) is to be reset.

Figure 7A:
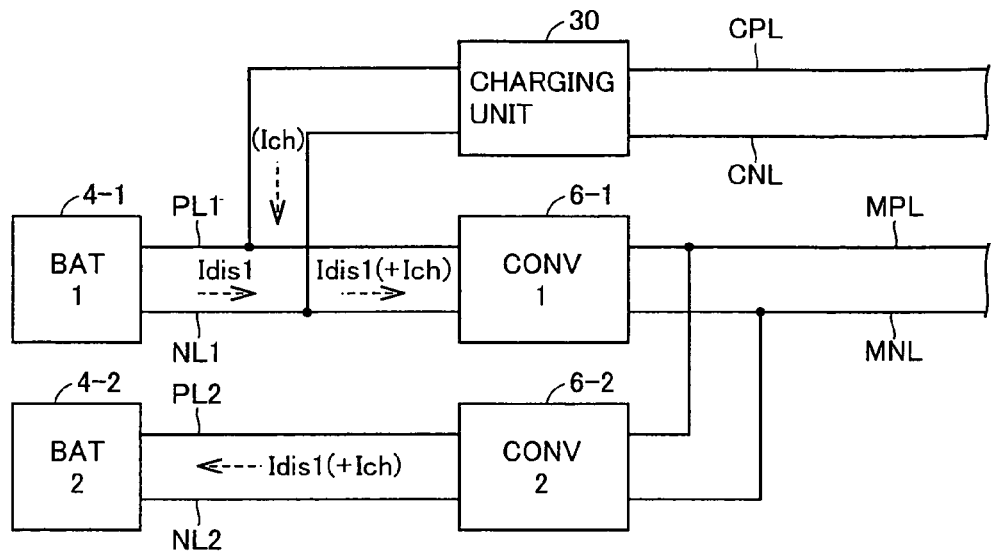
FIGS. 7A and 7B each illustrate a flow of a current during a reset operation.
Figure 7B:
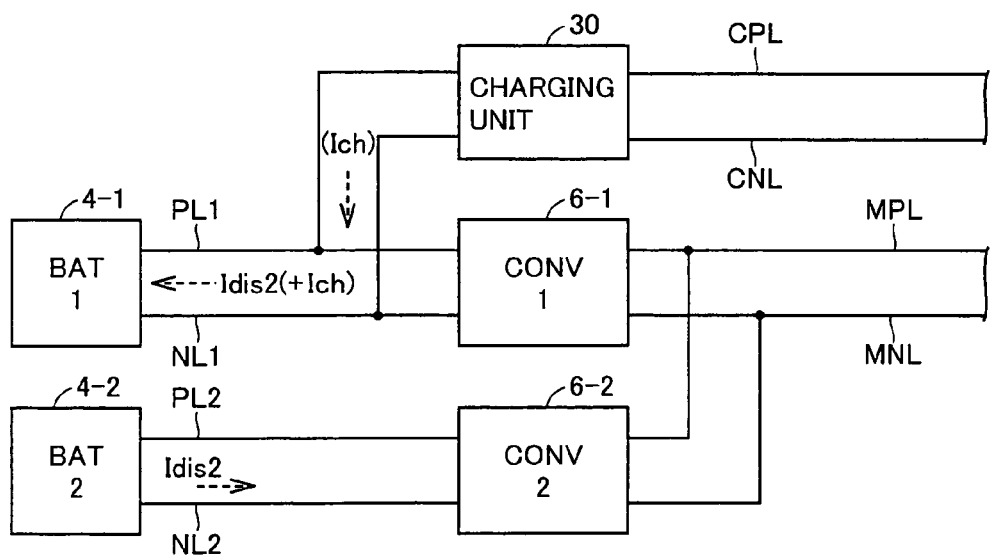

FIGS. 7A and 7B illustrate a flow of the current during the reset operation.

FIG. 7A shows the case where the SOC 1 reset request occurs.

FIG. 7B shows the case where the SOC2 reset request occurs.

Referring to FIG. 7A, when the SOC1 reset request occurs and the charging by the external power supply becomes possible, first converter 6-1 performs the voltage converting operation to charge second power storage unit 4-2 with a discharge current Idis1 discharged from first power storage unit 4-1. Thus, first converter 6-1 performs the step-up operation using discharge current Idis1 as a current target value. Second converter 6-2 performs the step-down operation so that the current of substantially the same value as the current flowing in first converter 6-1 may be supplied to second power storage unit 4-2.

In this manner, first power storage unit 4-1 continues the discharging until the distinctive time-based change occurs in battery voltage Vbat1, i.e., until the SOC1 is reset. When the allowed charge current value of second power storage unit 4-2 is larger than discharge current Idis1, the difference between them may be compensate for by a charge current Ich provided from charging unit 30. In this case, charging unit 30 supplies charge current Ich, and first converter 6-1 performs the step-up operation with a current target value equal to (Idis1+Ich), which corresponds to an allowed charge current value of second power storage unit 4-2. Thereby, second power storage unit 4-2 is charged with (Idis1+Ich).

Referring to FIG. 7B, when the SOC2 reset request occurs and the system enters the state allowing the charging by the external power supply, second converter 6-2 performs the voltage converting operation so that first power storage unit 4-1 may be charged with at least a discharge current Idis2 discharged from second power storage unit 4-2. Thus, second converter 6-2 performs the step-up operation using Idis2 as the current target value. First converter 6-1 performs the step-down operation so that first power storage unit 4-1 may be supplied with the current of the value substantially equal to that of the current flowing through second converter 6-2.

As described above, second power storage unit 4-2 continues the discharging until the distinctive time-based change occurs in battery voltage Vbat2, i.e., when SOC2 is reset. Similarly to FIG. 7A, when the allowed charge current value of first power storage unit 4-1 is larger than discharge current Idis2, the difference between them may be compensated for by charge current Ich supplied from charging unit 30.

During the reset operation, as shown in FIGS. 7A and 7B, the charge power in first power storage unit 4-1 moves to second power storage unit 4-2, or the charge power in second power storage unit 4-2 moves to first power storage unit 4-1. Therefore, the fact that the total SOC of first and second power storage units 4-1 and 4-2 is equal to or lower than 100% may be handled as the start condition of the reset operation. Thus, the system may be configured to start the reset operation under the condition that the charge power remaining in the power storage unit(s) to be reset can be stored in the remaining power storage unit(s). This is because the charge power of the power storage unit of the reset target must be consumed by some load when this charge power cannot be entirely used for charging the remaining power storage unit(s). In this above case, the system may be configured, e.g., to consume the electric power by the air conditioning in the vehicle cabin.

Referring to FIG. 3 again, after the power storage unit to be reset is reset as described above, the external charging of power storage units 4-1 and 4-2 starts. More specifically, converter control unit 210 controls the converters so that the operations of charging these power storage units by the external power supply may be completed substantially simultaneously. For this simultaneous, converter control unit 210 controls the converter corresponding to charging unit 30 to be reset with the charge current supplied from this charging unit 30, and also controls the corresponding converter corresponding to the remaining power storage unit(s) so that the charge current for it may be larger than the charge current used for the remaining power storage unit(s). Thus, converter control unit 210 charges the power storage unit to be reset with the larger charge current after the reset, and thereby suppresses the occurrence of a difference in charge completion time between the power storage unit to be reset and the remaining power storage unit(s).

Conversely, when the SOC1 or SOC2 reset request occurs during traveling of vehicle 100 which is in the EV travel mode, converter control unit 210 controls converters 6-1 and 6-2 so that the discharge current from the power storage unit to be reset may be larger than the discharge current from the remaining power storage unit(s). This is for lowering in advance the SOC of the power storage unit to be reset and thereby rapidly performing the reset operation.

Figure 8:
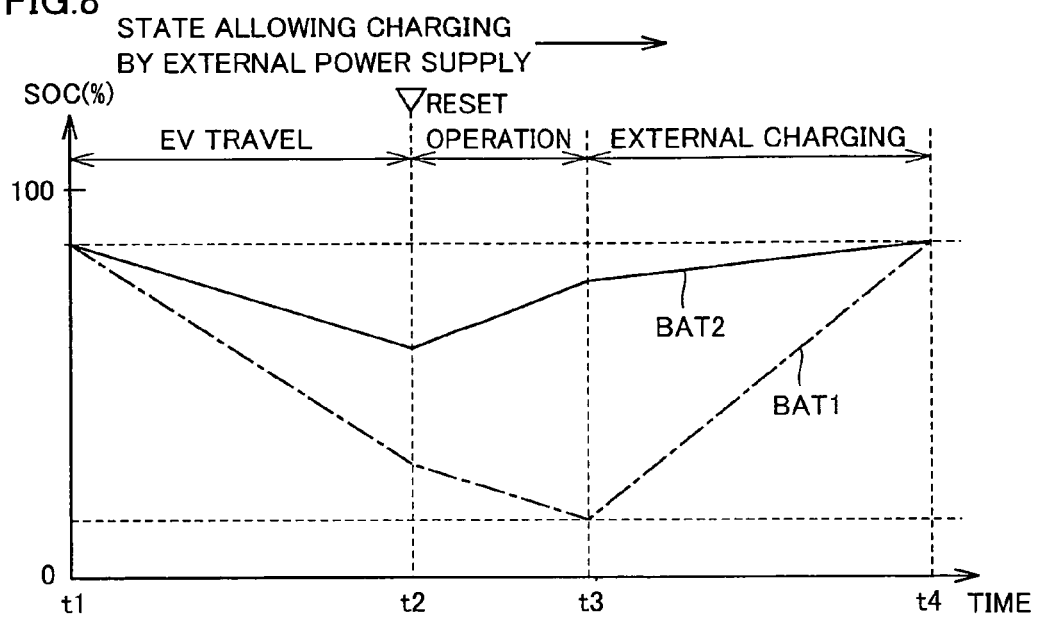
FIG. 8 shows an example of temporal changes in SOC of the power storage units.
Figure 9:
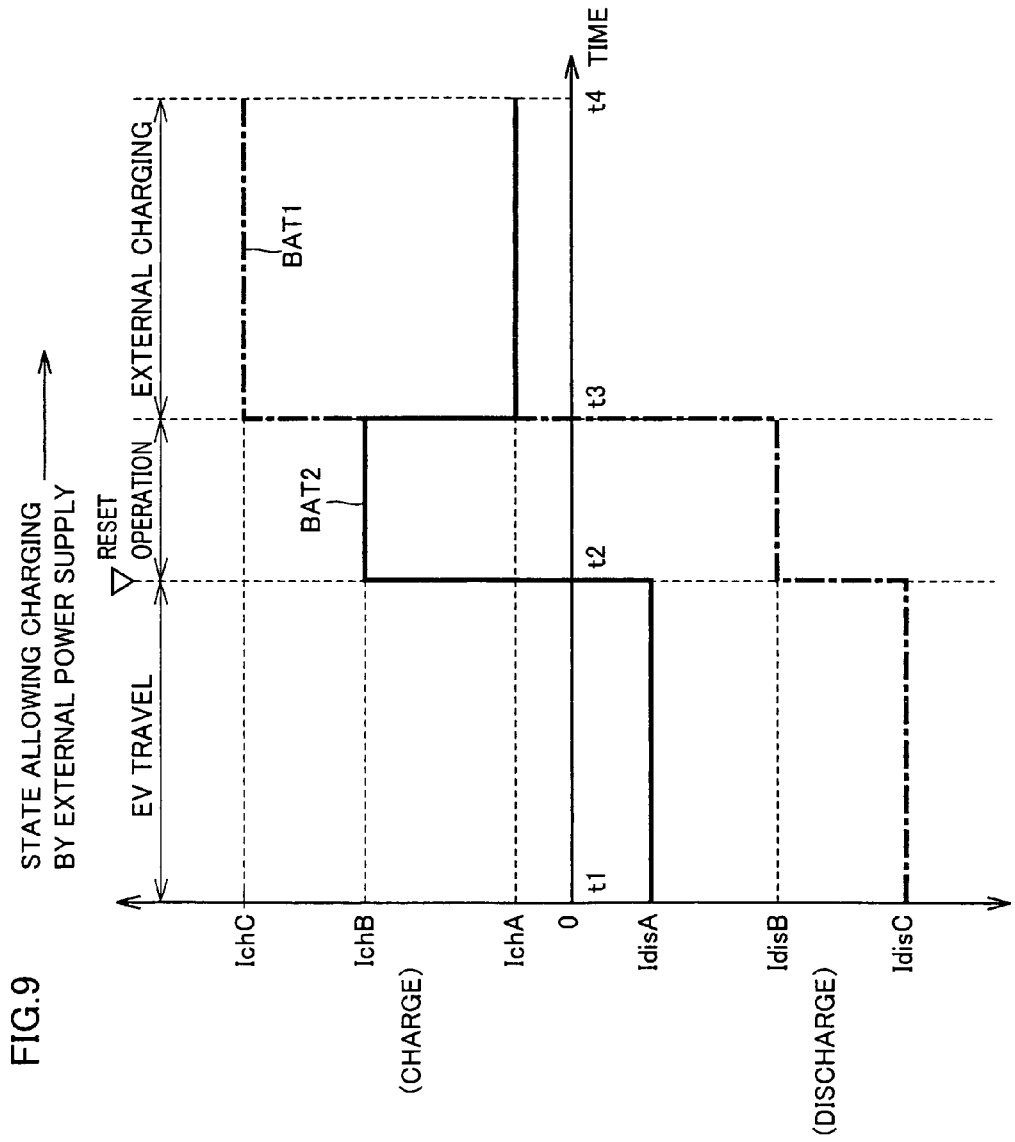
FIG. 9 shows an example of temporal changes in battery current of the power storage units, corresponding to FIG. 8.

Referring to FIGS. 8 and 9, the description will be given on the charge/discharge operations of power storage units 4-1 and 4-2 during the EV traveling, during the reset operation and after the reset operation.

FIG. 8 shows an example of the time-based changes in SOC of power storage units 4-1 and 4-2.

FIG. 9 shows an example of the time-based changes in battery current of power storage units 4-1 and 4-2.

Referring to FIG. 8, vehicle 100 starts the traveling at time t1. At time t1, both power storage units 4-1 and 4-2 have been sufficiently charged and both the SOCs of them exhibit the fully charged states. In this case, vehicle 100 first starts the traveling in the EV travel mode (time t1 to time t2).

When the reset request (SOC1 reset request) for first power storage unit 4-1 is issued, the current control is performed to discharge actively first power storage unit 4-1. More specifically, as shown in FIG. 9, the target value of the discharge current of first power storage unit 4-1 is set to IdisC, and the target value of the discharge current of second power storage unit 4-2 is set to IdisA, which satisfies a relationship of "|IdisC|>|IdisA|".

Thereby, as shown in FIG. 8, the SOC of first power storage unit 4-1 exhibits a reduction rate larger than that of the SOC of second power storage unit 4-2.

At subsequent time t2, vehicle 100 ends the traveling, and the charging by the external power supply becomes possible.

At this time t2, the SOC is kept higher than the reference SOC (e.g., of 5%) at which the distinctive point appears in battery voltage. This is for the purpose of executing the reset operation itself during the period when the charging by the external power supply is allowed. For example, the SOC of the power storage unit to be reset (i.e., first power storage unit 4-1 in this case) is kept higher than the reference SOC during the EV travel mode or after the change from the EV travel mode to the HV travel mode.

After time t2 when the charging by the external power supply becomes possible, the discharge current of first power storage unit 4-1 to be reset is kept at a constant current value disB, and second power storage unit 4-2 not to be reset is charged with a charge current IchB including at least a discharge current IdisB of first power storage unit 4-1. This charge current IchB may include the charge current supplied from charging unit 30 in addition to discharge current IdisB discharged from first power storage unit 4-1.

When constant current value disB is continuously discharged from first power storage unit 4-1, it is assumed that the distinctive point appears in the battery voltage (discharge voltage) of first power storage unit 4-1 at time t3. At time t3, the estimated value of the SOC of first power storage unit 4-1 is reset, e.g., to a predetermined reference value, e.g., of 5%.

After this reset operation (after time t3), ordinary external charging starts. As shown in FIG. 9, first power storage unit 4-1 is charged with a charge current IchC, and the charge current of second power storage unit 4-2 is changed from IchB to IchA. There is a relationship of "|IchC|>|IchA|", and the values of charge currents IchC and IchA are processed in advance so that the charging of both power storage units 4-1 and 4-2 may be completed to attain the fully charged state at time t4.

As described above, first and second power storage units 4-1 and 4-2 continue the charging with charge currents IchC and IchA during a period between times t3 and t4, respectively, so that the external charging of them can be completed substantially simultaneously at time t4.

The correlation between the embodiment of the invention shown in FIG. 3 and the present invention is as follows. State estimating unit 204 corresponds to a "state estimating unit", converter control unit 210 corresponds to a "control unit" and request generating unit 202 corresponds to a "request generating unit".

The processing described above may be expressed collectively in a processing flow shown in FIG. 10.

(Flow Chart)

FIG. 10 is a flowchart illustrating a processing procedure of a rest operation according to an embodiment of the invention. Processing in each step shown in FIG. 10 can be implemented by control device 2 in FIG. 2 functioning as the control block in FIG. 3.

Referring to FIGS. 3 and 10, control device 2 functioning as request generating unit 202 determines whether the reset request for power storage unit 4-1 or 4-2 is to be issued or not, based on the charge frequency of power storage unit 4-1 or 4-2 (step S100).

When neither of power storage units 4-1 and 4-2 requires the issuance of the reset request (NO in step S100), the process returns to the start.

In contrast, when power storage unit 4-1 or 4-2 requires the issuance of the reset request (YES in step S100), control device 2 functioning as request generating unit 202 specifies the power storage unit to be reset and issues the reset request (step S102).

Then, control device 2 functioning as converter control unit 210 determines whether vehicle 100 is traveling in the EV travel mode or not (step S104). When vehicle 100 is traveling in the EV travel mode (YES in step S104), control device 2 functioning as converter control unit 210 sets an allotted ratio of the discharge power discharged from the power storage unit to be reset to be larger than an allotted ratio (ratios) of the discharge power discharged from the remaining power storage unit(s) (step S106). Control device 2 functioning as converter control unit 210 controls the voltage converting operations of converters 6-1 and 6-2 according to the allotted ratios set in step S106 (step S108).

Further, control device 2 functioning as converter control unit 210 determines whether vehicle 100 is inactive (in the IG-OFF state) or not (step S110). When vehicle 100 is not inactive (in the IG-OFF state) (NO in step S110), the process returns to step S104.

In contrast, when vehicle 100 is inactive (IG-OFF state) (YES in step S110), control device 2 functioning as converter control unit 210 will be on standby until connector unit 350 is connected to vehicle 100 (step S112). When connector unit 350 is coupled to vehicle 100, control device 2 functioning as converter control unit 210 determines that the system enters the state in which the charging by the external power supply is allowed, controls the corresponding converter to discharge the power storage unit to be reset with the predetermined current, and also controls the voltage converting operation in the corresponding converter to charge the remaining power storage unit(s) with at least the discharge current discharged from the power storage unit to be reset (step S114). Further, control device 2 functioning as converter control unit 210 determines whether a distinctive time-based change has occurred in the battery voltage (discharge voltage) of the power storage unit to be reset or not (step S116).

When the distinctive time-based change has not occurred in the battery voltage (discharge voltage) of the power storage unit to be reset (NO in step S116), the process returns to step S114.

In contrast, when the distinctive time-based change has occurred in the battery voltage (discharge voltage) of the power storage unit to be reset (YES in step S116), control device 2 functioning as state estimating unit 204 resets the SOC of the power storage unit to be reset, and thus the SOC to be successively processed to the predetermined reference value (step S118).

After this reset operation, control device 2 functioning as converter control unit 210 determines the ratios of the charge currents with respect to the respective power storage units so that the charging of all the power storage units may be completed substantially simultaneously (step S120), and controls the voltage converting operations of converters 6-1 and 6-2 according to the current ratios thus determined (step S122).

Further, control device 2 functioning as converter control unit 210 determines whether the external charging of each power storage unit is completed or not, based on the SOC that is successively processed by state estimating unit 204 (step S124). When the external charging of neither of the power storage units is completed (NO in step S124), the process proceeds to step S122.

In contrast, when the external charging of all the power storage units is completed (YES in step S124), the processing relating to the reset operation ends.

Vehicle 100 provided with power storage units 4-1 and 4-2 has been described as a typical example of the vehicle provided with the plurality of power storage units. However, it is obvious that the invention can be applied to the vehicle provided with three or more power storage units.

It has been described by way of example that all the power storage units have basically and substantially the same charge capacity. However, the present invention may be applied to the case where the power storage units have different charge capacity from one another.

According to the embodiment of the invention, the power storage unit to be reset is discharged by controlling the corresponding converter during the period when the charging by the external power supply is allowed. The estimated value of the state of charge (SOC) of the power storage unit to be reset, and thus the estimated value that is successively calculated by the state estimating unit is reset to the predetermined reference value according to the predetermined timing based on the time-based change in discharge voltage of the power storage unit to be reset, and more specifically the time-based change that is caused by the above discharge current. Therefore, even when an error occurs in SOC of the power storage unit to be reset due to the integrated value of the charge/discharge quantity, the reset (calibration) can be performed during the period when the charging by the external power supply is allowed. Thereby, it is possible to enhance the estimation accuracy of the SOC of each power storage unit.

Further, according to the embodiment of the invention, when the reset request is already generated before the external charging, the power storage unit to be reset is actively discharged while the vehicle is traveling in the EV travel mode. Thereby, when the vehicle ends the traveling and enters the state allowing the charging by the external power supply, the SOC of the power storage unit to be reset can be kept at a lower value than the SOC of the remaining power storage unit(s). Thereby, the reset operation for the power storage unit to be reset can be completed in a shorter time.

According to the embodiment of the invention, the power storage unit to be reset is externally charged with the charge current larger than the charge current used for the remaining power storage unit(s) after the reset operation ended. Thereby, the external charging performed on the power storage unit to be reset, i.e., the power storage unit that has the relatively low SOC when the reset operation ends can be completed substantially at the same time as the end of the external charging performed on the remaining power storage unit(s). Accordingly, it is possible to suppress an imbalance in state of charge between the power storage unit to be reset and the remaining power storage unit(s).

According to the embodiment of the invention, the power storage unit to be reset is sufficiently discharged by the reset operation so that the estimation accuracy of the SOC can be enhanced, and the power storage unit itself can be refreshed.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A power supply system comprising:
a plurality of power storage units;
a plurality of voltage converting units corresponding to said plurality of power storage units, respectively;
a power line pair connected to said plurality of voltage converting units in parallel;
a charging unit for charging said plurality of power storage units by receiving an electric power from an external power supply;
a state estimating unit for estimating a charge state value of each of said plurality of power storage units, said state estimating unit successively calculating the charge state value of each of said plurality of power storage units based on an integrated value of a charge/discharge quantity of each of the power storage units; and
a control unit for controlling a voltage converting operation in said plurality of voltage converting units, wherein
when said plurality of power storage units become chargeable by the external power supply, said control unit controls the voltage converting unit corresponding to a first power storage unit, which is any one among said plurality of power storage units, to discharge said first power storage unit, and controls the voltage converting unit(s) corresponding to the remaining power storage unit(s) to charge said remaining power storage unit with at least the discharge current discharged from said first power storage unit, and
said state estimating unit resets the charge state value of said first power storage unit to a reference value based on the discharge current of said first power storage unit before said plurality of power storage units is charged by the external power supply.

2. The power supply system according to claim 1, wherein said state estimating unit resets the charge state value of said first power storage unit to said reference value at predetermined timing based on a time-based change in discharge voltage of said first power storage unit.

3. The power supply system according to claim 1, wherein said control unit controls the voltage converting unit corresponding to said first power storage unit to charge said first power storage unit with the charge current supplied from said charging unit after said state estimating unit resets the charge state value of said first power storage unit to said reference value, and controls the corresponding voltage converting unit such that the charge current supplied to said first power storage unit is larger than the charge current supplied to said remaining power storage unit(s).

4. The power supply system according to claim 1, wherein said charging unit is electrically connected between said first power storage unit and the voltage converting unit corresponding to said first power storage unit.

5. The power supply system according to claim 1, further comprising:
a request generating unit for generating a reset request for said first power storage unit based on a charge/discharge frequency of said first power storage unit, wherein
said control unit starts the discharging from said first power storage unit in response to said reset request during the charging by said external power supply.

6. The power supply system according to claim 5, wherein said request generating unit is able to select the power storage unit specified by said reset request, based on the respective charge frequencies of said plurality of power storage units.

7. The power supply system according to claim 5, wherein said power supply system is configured to be able to supply an electric power to a load device electrically connected to said power supply system via said power line pair, and said control unit controls said plurality of voltage converting units in response to said reset request such that the discharge current discharged from said first power storage unit to said load device is larger than the discharge current discharged from each of said remaining power storage unit to said load device, before the start of charging said plurality of power storage units by the external power supply.

8. A vehicle comprising:
an engine;
a plurality of power storage units;
a plurality of voltage converting units corresponding to said plurality of power storage units, respectively;

a power line pair connected to said plurality of voltage converting units in parallel;

a charging unit for charging said plurality of power storage units by receiving an electric power from an external power supply;

an electric motor connected to said power line pair for generating a drive power by receiving the electric power from said plurality of power storage units;

a power generating unit connected to said power line pair for generating the electric power by receiving the drive power from said engine;

a state estimating unit for estimating a charge state value of each of said plurality of power storage units, said state estimating unit successively calculating the charge state value of each of said plurality of power storage units based on an integrated value of a charge/discharge quantity of each of the power storage units;

a control unit for controlling a voltage converting operation in any one of said plurality of voltage converting units; and a request generating unit for generating a reset request for one of said plurality of power storage units based on charge/discharge frequencies of said plurality of power storage units, wherein said vehicle is able to travel by selecting a first travel mode for restricting the charging of said plurality of power storage units by said power generating unit and a second travel mode for controlling the charging of said plurality of power storage units by said power generating unit to keep a charge state value of each of the power storage units within a predetermined range, when said reset request is issued, said control unit controls said plurality of voltage converting units such that the discharge current discharged from the power storage unit to be reset specified by said reset request to said electric motor becomes larger than the discharge current discharged from each of said remaining power storage unit(s) to said electric motor, during the traveling in the first travel mode, when said reset request is issued and a state allowing the charging of said plurality of power storage units by the external power supply is attained, said control unit controls the voltage converting unit corresponding to the power storage unit to be reset to discharge the power storage unit to be reset, and controls the voltage converting unit(s) corresponding to said remaining power storage unit(s) to charge said remaining power storage unit(s) with at least the discharge current discharged from said power storage unit to be reset, and said state estimating unit resets the charge state value of said power storage unit to be reset to a reference value based on the discharge current of said power storage unit to be reset before said plurality of power storage units is charged by the external power supply.

9. A charge/discharge control method of a power supply system provided with a plurality of power storage units, wherein said power supply system includes:

a plurality of voltage converting units corresponding to said plurality of power storage units, respectively, a power line pair connected to said plurality of voltage converting units in parallel, and a charging unit for charging said plurality of power storage units by receiving an electric power from an external power supply; and said charge/discharge control method comprise the steps of:

successively calculating, with an electronic control unit, a charge state value of each of said plurality of power storage units based on an integrated value of a charge/discharge quantity of each of the power storage units;

controlling, with the electronic control unit, the voltage converting unit corresponding to a first power storage unit, which is any one among said plurality of power storage units, to discharge said first power storage unit, and controlling the voltage converting unit corresponding to the remaining power storage unit(s) to charge the remaining power storage unit(s) with at least the discharge current discharged from said first power storage unit, when said plurality of power storage units become chargeable by the external power supply; and resetting, with the electronic control unit, the charge state value of said first power storage unit to a reference value based on the discharge current of said first power storage unit before said plurality of power storage units is charged by the external power supply.

* * * * *